United States Patent
Ren et al.

(10) Patent No.: US 12,289,081 B2
(45) Date of Patent: Apr. 29, 2025

(54) SIGNAL PROCESSING METHOD, APPARATUS, AND SYSTEM

(71) Applicant: HUAWEI TECHNOLOGIES CO., LTD., Shenzhen (CN)

(72) Inventors: Zhixiong Ren, Wuhan (CN); Tao Ouyang, Wuhan (CN)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 647 days.

(21) Appl. No.: 17/508,080

(22) Filed: Oct. 22, 2021

(65) Prior Publication Data

US 2022/0045649 A1 Feb. 10, 2022

Related U.S. Application Data

(63) Continuation of application No. PCT/CN2019/123584, filed on Dec. 6, 2019.

(30) Foreign Application Priority Data

Apr. 25, 2019 (CN) .......................... 201910340782.6

(51) Int. Cl.
*H03F 1/02* (2006.01)
*H03F 3/21* (2006.01)

(52) U.S. Cl.
CPC ........... *H03F 1/0288* (2013.01); *H03F 3/211* (2013.01)

(58) Field of Classification Search
CPC .. H03F 1/0288; H03F 3/211; H03F 2200/432; H03F 1/0277; H03F 1/0294; H03F 2200/451; H03F 3/195; H03F 3/245
USPC ........................................................ 330/295
See application file for complete search history.

(56) References Cited

U.S. PATENT DOCUMENTS

| 7,279,971 B2 | 10/2007 | Hellberg et al. |
| 7,755,452 B2 * | 7/2010 | Knickerbocker ....... H03F 3/602 333/131 |

(Continued)

FOREIGN PATENT DOCUMENTS

| CN | 102187570 A | 9/2011 |
| CN | 107005200 A | 8/2017 |

(Continued)

OTHER PUBLICATIONS

IEEE Std 802.11ac-2013, IEEE Standard for Information technology—Telecommunications and information exchange between systemsLocal and metropolitan area networks—Specific requirements—Part 11: Wireless LAN Medium Access Control (MAC) and Physical Layer (PHY) Specifications—Amendment 4: Enhancements for Very High Throughput for Operation in Bands below 6 GHz, Approved Dec. 11, 2013, total 425 pages.

(Continued)

*Primary Examiner* — Andrea Lindgren Baltzell
*Assistant Examiner* — Khiem D Nguyen
(74) *Attorney, Agent, or Firm* — Rimon PC

(57) ABSTRACT

A signal processing system includes n paths of load modulation modules and a combination module, where the n paths of load modulation modules are connected in parallel, an output end of each path of the load modulation modules is connected to an input end of the combination module, and n is an integer greater than 1; the n paths of load modulation modules include one path of main power amplification module and (n−1) paths of auxiliary power amplification modules, and the auxiliary power amplification modules are turned on when power values of signals received by input ends of the load modulation modules are greater than a first threshold; and the main power amplification module includes two outphasing power amplification units, and each (Continued)

path of auxiliary power amplification module includes two outphasing power amplifier arrays or one digital polar power amplifier array.

19 Claims, 11 Drawing Sheets

(56) References Cited

U.S. PATENT DOCUMENTS

| | | |
|---|---|---|
| 2006/0114060 A1 | 6/2006 | Hellberg et al. |
| 2010/0045385 A1 | 2/2010 | Pengelly |
| 2015/0194938 A1 | 7/2015 | Negra et al. |
| 2016/0241201 A1 | 8/2016 | Hellberg |
| 2017/0063316 A1 | 3/2017 | Akbarpour et al. |

FOREIGN PATENT DOCUMENTS

| | | |
|---|---|---|
| CN | 108093678 A | 5/2018 |
| CN | 108683412 A | 10/2018 |
| CN | 108923758 A | 11/2018 |
| WO | 2018074241 A1 | 4/2018 |

OTHER PUBLICATIONS

Mikko Martelius et al., A 30-dBm Class-D Power Amplifier with On/Off Logic for an Integrated Tri-Phasing Transmitter in 28-nm CMOS, 2018 IEEE Radio Frequency Integrated Circuits Symposium, total 4 pages.

IEEE Std 802.11g-2003, IEEE Standard for Information technology—Local and metropolitan area networks—Specific requirements—Part 11: Wireless LAN Medium Access Control (MAC) and Physical Layer (PHY) Specifications: Further Higher Data Rate Extension in the 2.4 GHz Band, total 78 pages.

IEEE P802.11ax /D2.2, Feb. 2018, Draft Standard for Information technology—Telecommunications and information exchange between systems Local and metropolitan area networks—Specific requirements—Part 11: Wireless LAN Medium Access Control(MAC) and Physical Layer (PHY) Specifications, Amendment 6: Enhancements for High Efficiency WLAN. 620 pages.

* cited by examiner

SIGNAL PROCESSING METHOD, APPARATUS, AND SYSTEM

CROSS-REFERENCE TO RELATED APPLICATIONS

This application is a continuation of International Application No. PCT/CN2019/123584, filed on Dec. 6, 2019, which claims priority to Chinese Patent Application No. 201910340782.6, filed on Apr. 25, 2019. The disclosures of the aforementioned applications are hereby incorporated by reference in their entireties.

TECHNICAL FIELD

Embodiments of this application relate to the field of signal processing, and in particular, to a signal processing method, apparatus, and system.

BACKGROUND

To meet increasing network rate requirements, two of the most commonly used methods are to expand a signal bandwidth and to improve spectrum utilization. For example, in a wireless Wi-Fi technology, a signal bandwidth has been expanded from 20 MHz in 802.11g to 160 MHz in 802.11ac, while signal modulation has been is improved from orthogonal frequency division multiplexing (OFDM) 64-QAM (Quadrature Amplitude Modulation, quadrature amplitude modulation) to OFDM 256-QAM, and a corresponding rate is increased from 54 Mbps to 3.5 Gbps. In a mobile communication technology, signal bandwidth has been expanded from 20 MHz in a long term evolution (LTE) technology in the 4th generation mobile communication technology (4G) to 100 MHz in the 5th generation mobile communication technology (5G), and a corresponding rate has been increased from 100 Mbps to more than 1 Gbps. In a coaxial cable access (Data Over Cable Service Interface Specifications, DOCSIS) technology, signal bandwidth has been expanded from 860 MHz in DOCSIS 1.0 to 1 GHz in DOCSIS 3.1, signal modulation has been improved from single-carrier 64/256-QAM to OFDM 4096-QAM, and a corresponding rate has been increased from 38 Mbps to 10 Gbps.

In conclusion, in current common communications systems employ large bandwidths and modulation through high-order QAM to send signals. However, usually, a signal that has a large bandwidth and that is modulated through high-order QAM causes an increase in a peak-to-average-ratio (PAR) of the signal. To ensure lossless transmission of the signal, a functional module in a communication link needs to operate in a backoff area based on the PAR.

As one of the core functional modules in the communication link, a power amplifier (PA) needs to have higher linearity in response to expansion of a bandwidth of a current signal. An increase in a PAR causes the PA to back off to an area with lower efficiency, resulting in a system energy loss and a temperature increase, and therefore, a complex heat dissipation system design needs to be added. Therefore, how to design an efficient PA to meet a current requirement in transmission of a signal with a large bandwidth and a high PAR becomes a problem that needs to be resolved urgently.

In structures such as a Doherty power amplifier and a Class-G power amplifier in a conventional technology, a size of a corresponding backoff area is 6 dB. To improve efficiency of the backoff area, in the conventional technology, methods such as increasing a quantity of paths of auxiliary power amplifiers in the Doherty power amplifier are usually used. However, this method greatly increases a size of the power amplifier while improving the efficiency of the backoff area.

SUMMARY

This application provides a signal processing method, apparatus, and system, to effectively improve efficiency of a backoff area.

To achieve the foregoing objective, the following technical solutions are used in this application.

According to a first aspect, an embodiment of this application provides a signal processing system. The system includes n paths of load modulation modules and a combination module, where the n paths of load modulation modules are connected in parallel, an output end of each path of the load modulation modules is connected to an input end of the combination module, and n is an integer greater than 1; the combination module receives, by using the input end, n paths of signals output by the n paths of load modulation modules and combines the n paths of signals; the n paths of load modulation modules include one path of main power amplification module and (n−1) paths of auxiliary power amplification modules, and the auxiliary power amplification modules are turned on when power values of signals received by input ends of the load modulation modules are greater than a first threshold; and the main power amplification module includes two outphasing power amplification units, and each path of auxiliary power amplification module includes two outphasing power amplifier arrays or one digital polar power amplifier array.

According to the foregoing method, this application provides a system in which a quantity of paths of auxiliary power amplifiers does not need to be increased, but efficiency of a backoff area can be effectively improved, and in particular, efficiency of a deep backoff area can be improved.

In a possible implementation, the outphasing power amplification unit includes one digital outphasing power amplifier array. In other words, each path of the two paths of outphasing power amplification units includes one digital outphasing power amplifier array, and each digital outphasing power amplifier array includes two or more outphasing power amplifiers. Therefore, when the main power amplification module is turned on, a quantity of outphasing power amplifiers that are turned on in the main power amplification module is further controlled, to improve the efficiency of the backoff area.

In a possible implementation, the two outphasing power amplification units are connected in parallel.

In a possible implementation, the main power amplification module further includes a combination unit, where output ends of the two paths of outphasing power amplification units are separately connected to an input end of the combination unit, an output end of the combination unit is connected to the input end of the combination module, and the combination unit may be configured to receive, by using the input end, two paths of signals output by the two paths of outphasing power amplification units and combine the two paths of signals; and the combination unit and the combination module each include a transformer.

According to the foregoing method, a device size is reduced, and a system can be integrated into a chip by using a CMOS process.

In a possible implementation, the first combination unit is a Chireix combiner, and the second combination unit is a Doherty combiner.

According to the foregoing method, Chireix outphasing load modulation and Doherty load modulation are combined.

According to a second aspect, an embodiment of this application provides a signal processing method, where the method may be applied to the signal processing system according to the first aspect. The method includes: receiving signals by using n paths of load modulation modules connected in parallel; turning on one or more paths of load modulation modules in the n paths of load modulation modules based on power values of the signals; and if the power values are less than or equal to a first threshold, turning on one path of main power amplification module in the n paths of load modulation modules; or if the power values are greater than the first threshold, turning on the one path of main power amplification module and at least one path of auxiliary power amplification module in (n−1) paths of load modulation modules, where the main power amplification module includes two outphasing power amplification units, and the auxiliary power amplification module includes two outphasing power amplifier arrays or one digital polar power amplifier array.

In a possible implementation, the step of turning on one or more paths of load modulation modules in the n paths of load modulation modules based on power values of the signals includes: if amplitude values of the signals are less than or equal to a second threshold, turning on the main power amplification module; or if the amplitude values of the signals are greater than the second threshold, turning on the at least one path of auxiliary power amplification module.

In a possible implementation, the step of turning on the one path of main power amplification module and at least one path of auxiliary power amplification module in (n−1) paths of load modulation modules includes: if the amplitude values of the signals meet a trigger condition of one or more power amplifiers in the outphasing power amplifier arrays or the digital polar power amplifier array, turning on the one or more power amplifiers.

In a possible implementation, the step of turning on one or more paths of load modulation modules in the n paths of load modulation modules based on power values of the signals includes: if phase values of the signals are greater than or equal to a third threshold, turning on the main power amplification module; or if the phase values of the signals are less than the third threshold, turning on the at least one path of auxiliary power amplification module, where the phase values are obtained after outphasing conversion is performed on the signals.

In a possible implementation, the step of turning on the one path of main power amplification module and at least one path of auxiliary power amplification module in (n−1) paths of load modulation modules includes: if the phase values of the signals meet a trigger condition of one or more power amplifiers in the outphasing power amplifier arrays or the digital polar power amplifier array, turning on the one or more power amplifiers.

According to a third aspect, an embodiment of this application provides a signal processing apparatus, including: a control module, configured to control n paths of load modulation modules connected in parallel to receive signals, where the control module may be further configured to: turn on one or more paths of load modulation modules in the n paths of load modulation modules based on power values of the signals; and if the power values are less than or equal to a first threshold, turn on one path of main power amplification module in the n paths of load modulation modules; or if the power values are greater than the first threshold, turn on the one path of main power amplification module and at least one path of auxiliary power amplification module in (n−1) paths of load modulation modules, where the main power amplification module includes two outphasing power amplification units, and the auxiliary power amplification module includes two outphasing power amplifier arrays or one digital polar power amplifier array.

In a possible implementation, the control module is further configured to: if amplitude values of the signals are less than or equal to a second threshold, turn on the main power amplification module; or if the amplitude values of the signals are greater than the second threshold, turn on the at least one path of auxiliary power amplification module.

In a possible implementation, the control module is further configured to: if the amplitude values of the signals meet a trigger condition of one or more power amplifiers in the outphasing power amplifier arrays or the digital polar power amplifier array, turn on the one or more power amplifiers.

In a possible implementation, the control module is further configured to: if phase values of the signals are greater than or equal to a third threshold, turn on the main power amplification module; or if the phase values of the signals are less than the third threshold, turn on the at least one path of auxiliary power amplification module, where the phase values are obtained after outphasing conversion is performed on the signals.

In a possible implementation, the control module is further configured to: if the phase values of the signals meet a trigger condition of one or more power amplifiers in the outphasing power amplifier arrays or the digital polar power amplifier array, turn on the one or more power amplifiers.

According to a fourth aspect, an embodiment of this application provides a computer-readable medium, configured to store a computer program. The computer program includes instructions used to perform the method in the second aspect or any possible implementation of the second aspect.

According to a fifth aspect, an embodiment of this application provides a computer program. The computer program includes instructions used to perform the method in the second aspect or any possible implementation of the second aspect.

According to a sixth aspect, an embodiment of this application provides a chip. The chip includes a processing circuit and a transceiver pin. The transceiver pin communicates with the processing circuit by using an internal connection path, and the processing circuit performs the method in the second aspect or any possible implementation of the second aspect, to control the transceiver pin to receive a signal and send a signal.

BRIEF DESCRIPTION OF DRAWINGS

To describe the technical solutions in embodiments of this application more clearly, the following briefly describes the accompanying drawings required for describing the embodiments of this application. Apparently, the accompanying drawings in the following description show merely some embodiments of this application, and a person of ordinary skill in the art may still derive other drawings from these accompanying drawings without creative efforts.

DESCRIPTION OF EMBODIMENTS

The following clearly and describes the technical solutions in the embodiments of this application with reference to the accompanying drawings in the embodiments of this application. Apparently, the described embodiments are some but not all of the embodiments of this application. All other embodiments obtained by a person of ordinary skill in the art based on the embodiments of this application without creative efforts shall fall within the protection scope of this application.

The term "and/or" in this specification describes only an association relationship for associated objects and represents that three relationships may exist. For example, A and/or B may represent the following three cases: Only A exists, both A and B exist, and only B exists.

In the specification and claims in the embodiments of this application, the terms "first", "second", and so on are intended to distinguish between different objects but do not indicate a particular order of the objects. For example, a first target object, a second target object, and the like are intended to distinguish between different target objects but do not indicate a particular order of target objects.

In addition, in the embodiments of this application, the word "for example" is used to represent giving an example, an illustration, or a description. Any embodiment or design scheme described as "for example" in the embodiments of this application should not be explained as being more preferred or having more advantages than another embodiment or design scheme. Exactly, use of the word "for example" or the like is intended to present a relative concept in a specific method.

In the description of the embodiment of this application, unless otherwise stated, "a plurality of" means two or more than two. For example, a plurality of processing units refer to two or more processing units; and a plurality of systems refer to two or more systems.

To enable a person skilled in the art to better understand the technical solutions in the embodiments of this application, a conventional technology is first described.

Figure 1:
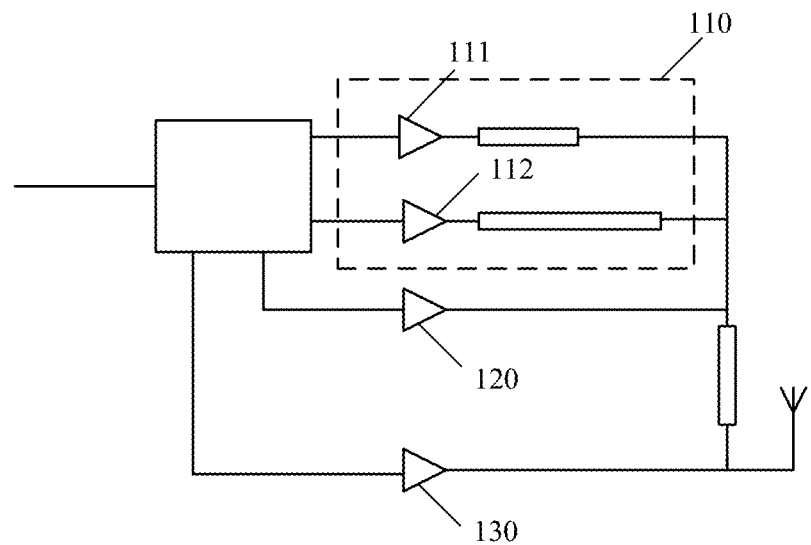
FIG. 1 is a schematic structural diagram of an example of a power amplifier.

FIG. 1 is a schematic structural diagram of a power amplifier in the conventional technology. In FIG. 1:

The power amplifier is of a multi-path analog Doherty (Doherty) PA structure, and includes a main power amplifier 110 and two paths of auxiliary power amplifiers: an auxiliary power amplifier 120 and an auxiliary power amplifier 130.

The main power amplifier includes a power amplifier 111 and a power amplifier 112, and the power amplifier 111 and the power amplifier 112 are two paths of outphasing power amplifiers.

The two paths of auxiliary power amplifiers further include an input signal separation unit, an output signal combiner, and the like (which are not marked in the figure).

Figure 2:
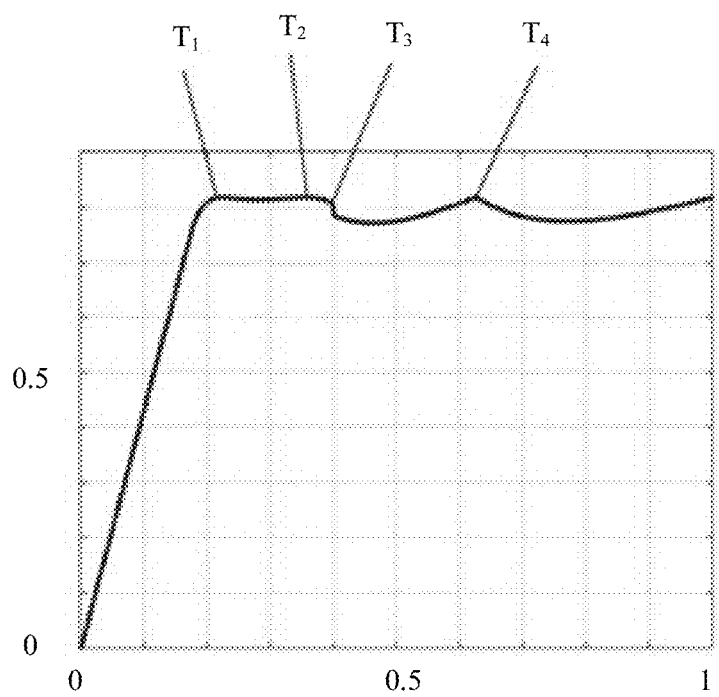
FIG. 2 shows an example of an efficiency curve.

It should be noted that, an operating principle of the Doherty PA structure is as follows: When an input signal (or may be described as a power of the input signal) is relatively small (a definition method of a relatively small input signal may be: if the power of the input signal is less than a preset threshold, the input signal is a relatively small signal; or if the power of the input signal is greater than or equal to the preset threshold, the input signal is a relatively large signal), the auxiliary power amplifiers (for example, the two paths of auxiliary power amplifiers 120 and 130 in FIG. 1) are in a non-operating state, and the main power amplifier is in an operating state. Refer to FIG. 1. In other words, when the PA operates in an outphasing mode, to be specific, the main power amplifier 110 is in the operating state, the PA amplifies the input signal, and an efficiency curve of the PA forms a first backoff area (to be specific, T1 to T2) shown in FIG. 2. In the Doherty PA, the auxiliary power amplifiers are turned on when the input signal is relatively large (in this case, the main power amplifier is still in the operating state, to be specific, all the main power amplifier and the auxiliary power amplifiers are in the operating state when the input signal is relatively large). Still refer to FIG. 1. As the input signal becomes larger, the auxiliary power amplifiers 120 and 130 are gradually turned on. In this case, the auxiliary power amplifier 120, the auxiliary power amplifier 130, and the main power amplifier form Doherty load modulation, and the efficiency curve forms a second backoff area and a third backoff area.

In the power amplifier structure shown in FIG. 1, a size of a backoff area is determined by a quantity of paths of auxiliary power amplifiers. That is, in the amplifier structure shown in FIG. 1 that includes the two paths of auxiliary power amplifiers, two backoff points may be added based on the outphasing main power amplifier. However, if a backoff point needs to be further added (that is, the size of the backoff area needs to be increased, or may be understood as improving efficiency of the backoff area), the quantity of the paths of auxiliary power amplifiers and a corresponding impedance conversion transmission line need to be added, resulting in a more complex structure of an output combiner and more complex separation of a corresponding input signal, and thereby reducing gain and efficiency of the entire PA.

Figure 3:
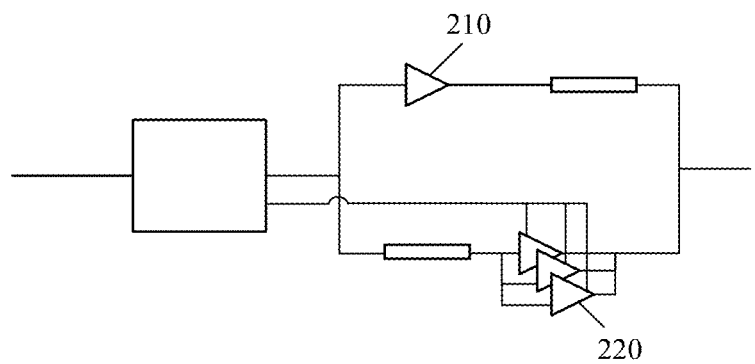
FIG. 3 is a schematic structural diagram of an example of a power amplifier.

FIG. 3 is a schematic structural diagram of another power amplifier in a conventional technology. In FIG. 3:

The power amplifier 200 incorporates a conventional analog Doherty PA structure and a digital polar PA structure. In a Doherty PA in the conventional technology, auxiliary power amplifiers are replaced by digital polar PAs (namely, 220 in the figure), and a main power amplifier is still a conventional analog PA (namely, 210 in the figure). Based on an operating principle of the Doherty PA, when an input signal is relatively small, all the auxiliary power amplifiers are turned off, and only the main power amplifier 210, namely, the analog PA, is in an operating state. As the input signal becomes larger, PAs in a digital polar power amplifier array (namely, the auxiliary power amplifiers 220) are gradually turned on. In this case, Doherty load modulation is formed between one path of main PA and one path of auxiliary PA.

Based on the power amplifier structure shown in FIG. 3, a size of a backoff area corresponding to the power amplifier structure is 6 dB. To be specific, the size of the backoff area is the same as a size of a backoff area that can be achieved by two paths of conventional analog Doherty PAs. In the power amplifier shown in FIG. 3, efficiency of the backoff area may be further improved by using an asymmetric Doherty structure. In other words, the size of the backoff area may be further increased. However, there is a problem in the asymmetric Doherty structure: If a relatively large backoff area needs to be achieved, for example, if a deep backoff area needs to be implemented (to be specific, more than 12 dB), a power of the auxiliary power amplifier needs to be at least three times as large as a power of the main power amplifier. Therefore, a size of the auxiliary power amplifier is relatively increased (with a relatively large increase amplitude). Consequently, in actual application, it is difficult to improve efficiency of the deep backoff area of the PA.

In conclusion, in the conventional technology a problem is that improvement of the efficiency of the backoff area greatly increases the size of the power amplifier, resulting in increased process difficulty and a failure to implement the deep backoff area, thus, this application provides a signal processing system. The system can effectively improve the efficiency of the backoff area by combining an outphasing load modulation method and a Doherty load modulation method, to implement the deep backoff area without additionally adding a quantity of paths of auxiliary power amplifiers.

Figure 4:
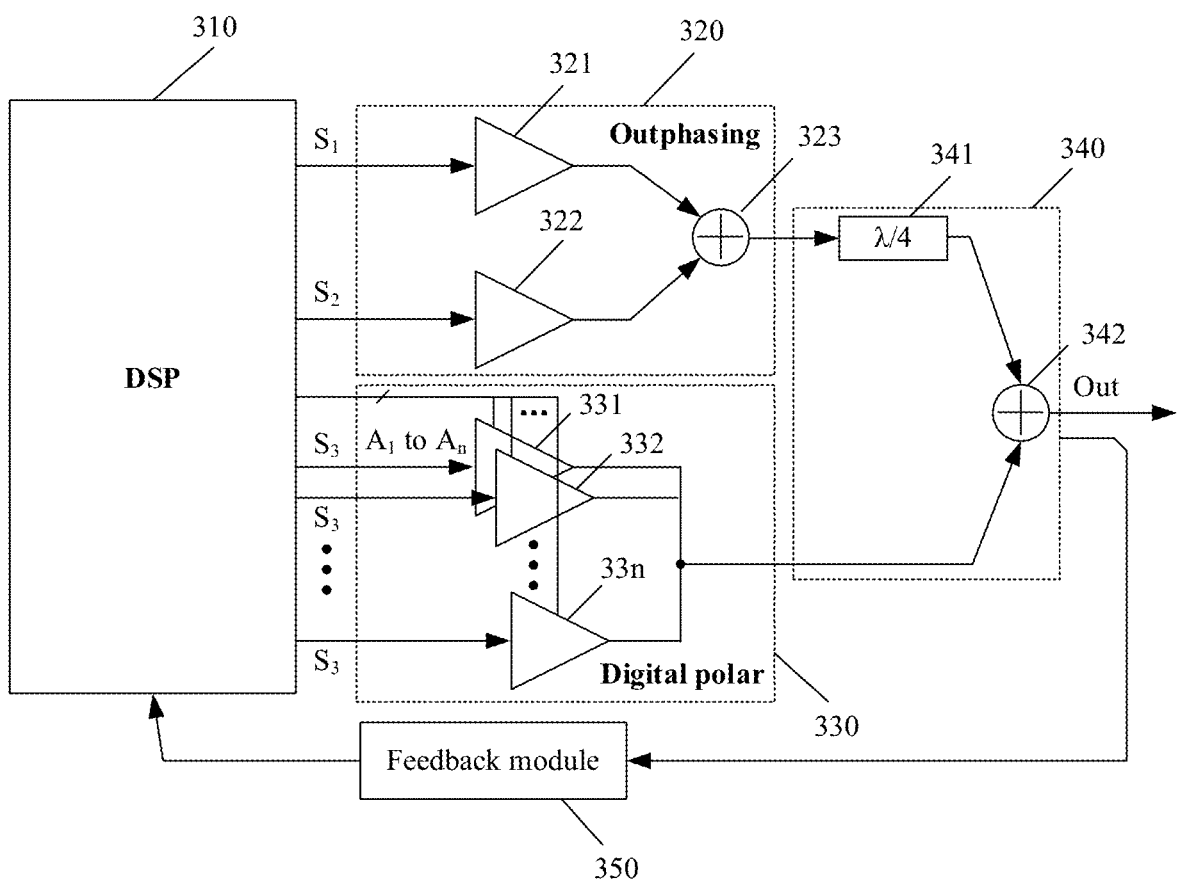
FIG. 4 is a schematic structural diagram of a signal processing system according to an embodiment of this application.

FIG. 4 is a schematic structural diagram of a signal processing system according to an embodiment of this application. In FIG. 4:

A signal processing system 300 includes a digital signal processing (DSP) module 310 and two paths of load modulation modules connected in parallel, where the two paths of load modulation modules include a main power amplification module 320 and an auxiliary power amplification module 330. In addition, the signal processing system 300 further includes a combination module 340 and a feedback module 350.

Refer to FIG. 4. An output end of the DSP module 310 in the signal processing system 300 is separately connected to input ends of the two paths of load modulation modules (namely, the main power amplification module 320 and the auxiliary power amplification module 330). In addition, an input end of the combination module 340 is separately connected to output ends of the two paths of load modulation modules (namely, the main power amplification module 320 and the auxiliary power amplification module 330). In addition, an output end of the combination module 340 is connected to an input end of the feedback module 350, and an output end of the feedback module 350 is connected to an input end of the DSP module 310, thereby forming a feedback loop. The feedback loop may be used to collect a signal output by a PA, and feed a collected signal back to the DSP module for processing such as calibration of undesirable factors such as distortion and mismatch. For a specific processing method of the feedback loop, refer to the technical solutions in the embodiment of the conventional technology. Details are not described in this application.

Optionally, in this application, the main power amplification module 320 includes two outphasing power amplifiers (namely, an outphasing power amplifier 321 and an outphasing power amplifier 322 in the figure) connected in parallel and a combination unit 323. Optionally, the combination unit 323 may be a low-isolation Chireix combiner, and includes an inductor and a capacitor. In another embodiment, the combiner may alternatively be another low-isolation combiner. This is not limited in this application.

The DSP module (for example, the DSP module 310) may be a DSP processor or a module including main functional units of a DSP processor.

In addition, the auxiliary power amplification module 330 includes a digital polar power amplifier array. In other words, an auxiliary power amplifier may be quantified as an array including a plurality of (to be specific, two or more) polar power amplifiers.

Optionally, in this application, the combination module 340 includes but is not limited to a transmission line 341 and a combiner 342. Optionally, the transmission line 341 may be a λ/4 transmission line, and is configured to perform impedance conversion of Doherty load modulation. Optionally, in this application, the combiner 342 may be a Doherty combiner.

Figure 5:
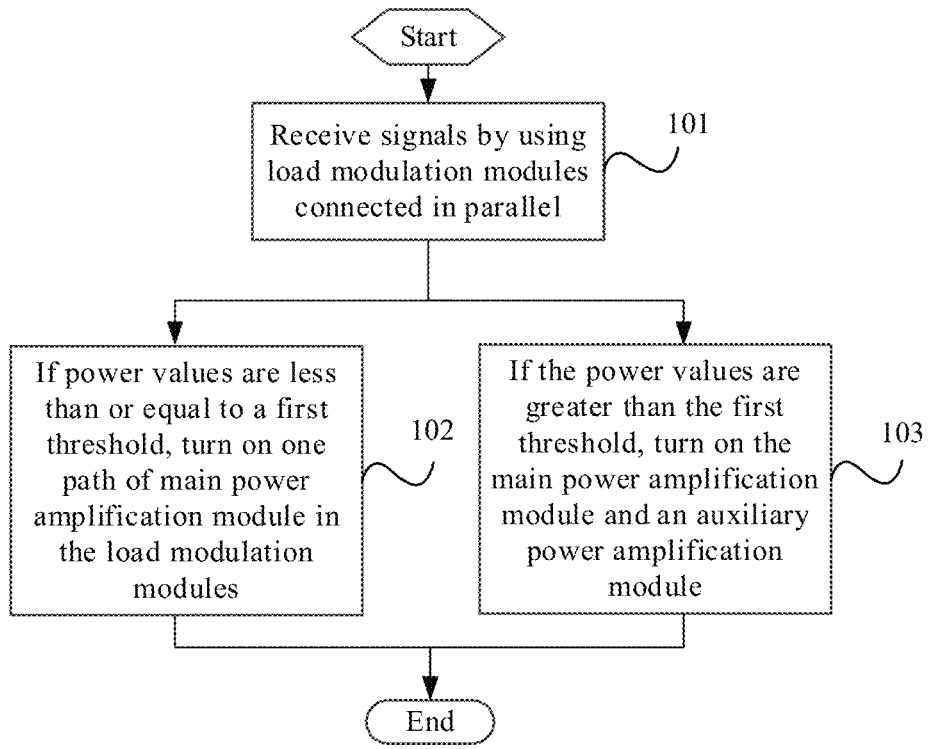
FIG. 5 is a flowchart of a signal processing method according to an embodiment of this application.

With reference to FIG. 4, FIG. 5 is a flowchart of a signal processing method according to an embodiment of this application. The method is applied to the signal processing system shown in FIG. 4. The method includes the following steps.

Step 101: Receive signals by using load modulation modules connected in parallel.

Specifically, in this embodiment of this application, the DSP module performs digital signal processing on a signal (to distinguish from another signal such as an output signal, the signal is collectively referred to as an input signal in this embodiment and the following embodiments), and then the DSP module sends a processed input signal to the input ends of the two paths of load modulation modules by using the output end. As shown in FIG. 4, the signals input into the two paths of load modulation modules include input signals $S_1$ and $S_2$ of the two paths of outphasing PAs, and an input signal $S_3$ and control signals $A_1$ to $A_n$ of the digital polar PAs.

Optionally, in this application, the load modulation modules may constitute a Doherty PA structure. To be specific, the load modulation modules in this application may operate in a Doherty load modulation mode. Specifically, based on the foregoing operating principle of the Doherty PA, that is, when the input signal is relatively small, the main power amplifier is turned on, and the auxiliary power amplifiers are turned off; and when the input signal is relatively large, the main power amplifier and the auxiliary power amplifiers are all turned on.

In this application, there may be two methods manners for determining a size of the input signal. One method for determining the size of the input signal is as follows: In this application, an amplitude threshold may be set, the DSP module may determine the size of the input signal based on the amplitude threshold, and determine a processing method corresponding to the input signal based on a determining result.

Figure 6:
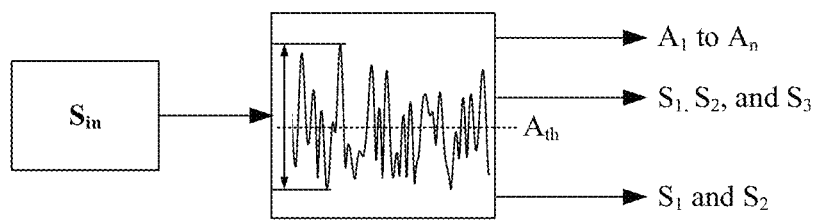
FIG. 6 is a schematic diagram of a polar solution according to an embodiment of this application.

Specifically, refer to FIG. 6. When an amplitude value of the input signal is less than or equal to an amplitude threshold $A_{th}$, the DSP module converts the input signal $S_{in}$ into the two paths of signals S and $S_2$, and outputs the two paths of signals to the main power amplification module, so that the main power amplification module is in an operating state. Then, step 102 is performed. When the amplitude value of the input signal is greater than the amplitude threshold $A_{th}$, the DSP module converts the input signal into the input signal $S_3$, the control signals $A_1$ to $A_n$, and the two paths of signals S and $S_2$. The input signal $S_3$ and the control signals $A_1$ to $A_n$ are used to enable the auxiliary power amplification module to be in an operating state. Then, step 103 is performed. For a method in which one or more power amplifiers in a power amplifier array included in the auxiliary power amplification module are turned on by using the control signals $A_1$ to $A_n$, refer to step 103.

For example, the input signal $S_{in}$ may be expressed as:

$$S_{in}=A(t)\times\cos(\omega t+\varphi(t)),$$

where A(t) is an amplitude-modulated signal, φ(t) is a phase-modulated signal, and ω is a carrier frequency.

The DSP module may obtain the amplitude value of the input signal based on an envelope value of the input signal, and determine a power of the input signal based on the amplitude value (that is, if the amplitude value is less than or equal to the amplitude threshold, the input signal is a relatively small signal, and a corresponding power is also relatively small; or if the amplitude value is greater than the amplitude threshold, the input signal is a relatively large signal).

Optionally, if the DSP module detects that the input signal is relatively small, the DSP module performs outphasing processing on the signal, to obtain the separated two paths of signals $S_1$ and $S_2$, which are expressed as follows:

$$S_1=A_0\times\cos(\omega t+\varphi(t)+\theta(t)); \text{ and}$$

$$S_2=A_0\times\cos(\omega t+\varphi(t)-\theta(t)),$$

where $A_0$=max(abs(A(t))), θ(t)=arccos(0.5×A(t)/$A_0$), and θ(t) is a phase value.

The DSP module 310 outputs the two paths of signals $S_1$ and $S_2$ to the main power amplification module, to turn on the two paths of outphasing power amplifiers in the main power amplification module 320.

Optionally, if the DSP module 310 detects that the input signal is relatively large, the DSP module 310 performs outphasing processing on the signal, to obtain the two paths of signals $S_1$ and $S_2$ that are used to turn on the main power amplification module. In addition, the DSP module 310 performs polar processing on the signal, to obtain the input signal $S_3$ and the control signals $A_1$ to $A_n$ that are used to turn on the auxiliary power amplification module. For specific details of performing polar processing on the input signal by the DSP module 310, refer to the technical solutions in the conventional technology. Details are not described in this application.

In this application, the other method for determining the size of the input signal is as follows: In this application, a phase threshold may be set, and the DSP module 310 may perform outphasing processing on the input signal $S_{in}$ (for a processing process, refer to the foregoing), to obtain a phase value θ(t)∈[0, π/2] related to amplitude information. Smaller amplitude of the input signal indicates a larger value of 0 (t). Otherwise, larger amplitude of the input signal indicates a smaller value of θ(t).

Figure 7:
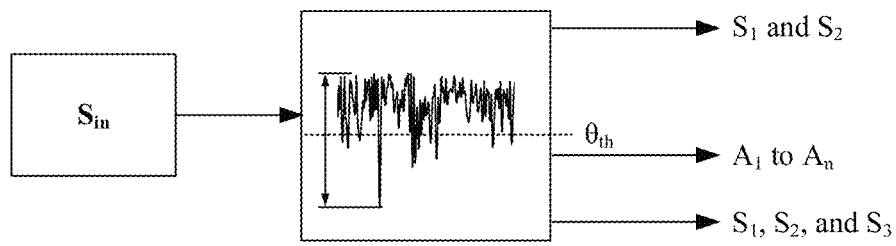
FIG. 7 is a schematic diagram of a polar solution according to an embodiment of this application.

As the amplitude of the input signal increases, the control signals $A_1$ to $A_n$ control the polar PAs in the digital polar amplifier array included in the auxiliary power amplification module 330 to be turned on. Because the amplitude is related to θ(t), θ(t) may be directly converted into the control signals $A_1$ to $A_n$. As shown in FIG. 7, larger amplitude indicates a smaller value of θ(t). When θ(t) is less than a phase threshold $θ_{th}$, signals $A_1$ to $A_n$ and $S_3$ obtained after polar processing are output, and $S_1$ and $S_2$ obtained after outphasing conversion are output. That is, all of the two paths of outphasing power amplifiers 321 and 322 and one or more polar power amplifiers in the digital polar power amplifier array are in the operating state.

Step 102: If power values are less than or equal to a first threshold, turn on one path of main power amplification module in the load modulation modules.

Specifically, in this application, as described above, the DSP module 310 may determine the power of the input signal based on the amplitude value of the input signal or based on the phase value of the input signal that is obtained after outphasing conversion. That is, when the amplitude value is less than or equal to the amplitude threshold or the phase value obtained after conversion is greater than or equal to the phase threshold, it may be determined that the input signal is a relatively small signal, that is, a power value of the input signal is less than or equal to a power threshold. When the amplitude value is greater than the amplitude threshold or the phase value obtained after conversion is less than the phase threshold, it may be determined that the input signal is a relatively large signal, that is, the power value of the input signal is greater than the power threshold.

Therefore, in this application, if the DSP module determines that the input signal is a relatively small signal, as described above, the DSP module performs outphasing conversion on the input signal to obtain the two paths of signals $S_1$ and $S_2$, outputs $S_1$ to the outphasing power amplifier 321 in the main power amplification module 320, and outputs $S_2$ to the outphasing power amplifier 322 in the main power amplification module 320, to turn on the two paths of outphasing power amplifiers. The outphasing power amplifiers respectively amplify the two paths of signals, and output processed signals to the Chireix combiner 323 in the main power amplification module 320.

Subsequently, the Chireix combiner outputs a combined signal to the combination module 340. The signal is transmitted to the Doherty combiner 342 by using the transmission line 341. The Doherty combiner 342 processes the signal and outputs the signal by using an output end, and the feedback loop collects the signal output by the Doherty combiner 342 and feeds the signal back to the DSP module 310.

Step 103: If the power values are greater than the first threshold, turn on the main power amplification module and the auxiliary power amplification module.

Still refer to FIG. 4. If the DSP module 310 determines that the input signal is a relatively large signal, as described above, optionally, the DSP module 310 may perform outphasing conversion on the input signal to obtain the two paths of signals $S_1$ and $S_2$, outputs $S_1$ to the outphasing power amplifier 321 in the main power amplification module 320, and outputs $S_2$ to the outphasing power amplifier 322 in the main power amplification module 320, to turn on the two paths of outphasing power amplifiers. The outphasing power amplifiers respectively amplify the two paths of signals, and output processed signals to the Chireix combiner 323 in the main power amplification module 320. In addition, the DSP module 310 performs polar processing on the input signal, to obtain the input signal $S_3$ and the control signals $A_1$ to $A_n$.

Optionally, in this application, the DSP module 310 stores a trigger condition of one or more power amplifiers in the digital polar power amplifier array.

Optionally, in this application, the DSP module 310 may determine, based on a size of the amplitude value, whether a trigger condition of a polar power amplifier is met. If the trigger condition of the polar power amplifier is met, a control signal is sent to the polar power amplifier whose trigger condition is met. For example, a trigger condition of a polar PA 331 in the digital polar power amplifier array is as follows: When the amplitude value reaches an amplitude value 1 (the value may be set based on an actual requirement, and is not limited in this application), the polar PA 331 is turned on. A trigger condition of a polar PA 332 is that the amplitude value reaches an amplitude value 2, and a trigger condition of a polar PA 333 (which is not shown in the figure) is that the amplitude value reaches an amplitude value 3. In this application, when it is detected that the amplitude value of the input signal reaches the amplitude value 1, the DSP module 310 outputs the control signal $A_1$ to control the polar PA 331 to be turned on, and amplifies the input signal $S_3$. When it is detected that the amplitude value of the input signal reaches the amplitude value 2, the DSP module 310 outputs the control signals $A_1$ and $A_2$, to control the polar PA 331 and the polar PA 332 to be turned on. When it is detected that the amplitude value of the input signal reaches the amplitude value 3, the DSP module 310 outputs the control signals $A_1$, $A_2$, and $A_3$, to control the polar PA 331, the polar PA 332, and the polar PA 333 to be turned on.

Optionally, in this application, the DSP module 310 may determine, based on a size of the phase value obtained after outphasing conversion, whether a trigger condition of a polar power amplifier is met. If the trigger condition of the polar power amplifier is met, a control signal is sent to the polar power amplifier whose trigger condition is met. For example, a trigger condition of the polar PA 331 in the digital polar power amplifier array is as follows: When the phase value reaches a phase value 1 (the value may be set based on an actual requirement, and is not limited in this application), the polar PA 331 is turned on. A trigger condition of the polar power amplifier 332 is that the phase value reaches a phase value 2, and a trigger condition of the polar PA 333 is that the phase value reaches a phase value 3. In this application, when it is detected that the phase value of the input signal that is obtained after outphasing conversion reaches the phase value 1, the DSP module 310 outputs the control signal $A_1$ to control the polar power amplifier 331 to be turned on, and amplifies the input signal $S_3$. When it is detected that the phase value of the input signal reaches the phase value 2, the DSP module 310 outputs the control signals $A_1$ and $A_2$, to control the polar PA 331 and the polar PA 332 to be turned on. When it is detected that the phase value of the input signal reaches the phase value 3, the DSP module 310 outputs the control signals $A_1$, $A_2$, and $A_3$, to control the polar PA 331, the polar PA 332, and the polar PA 333 to be turned on.

Figure 8:
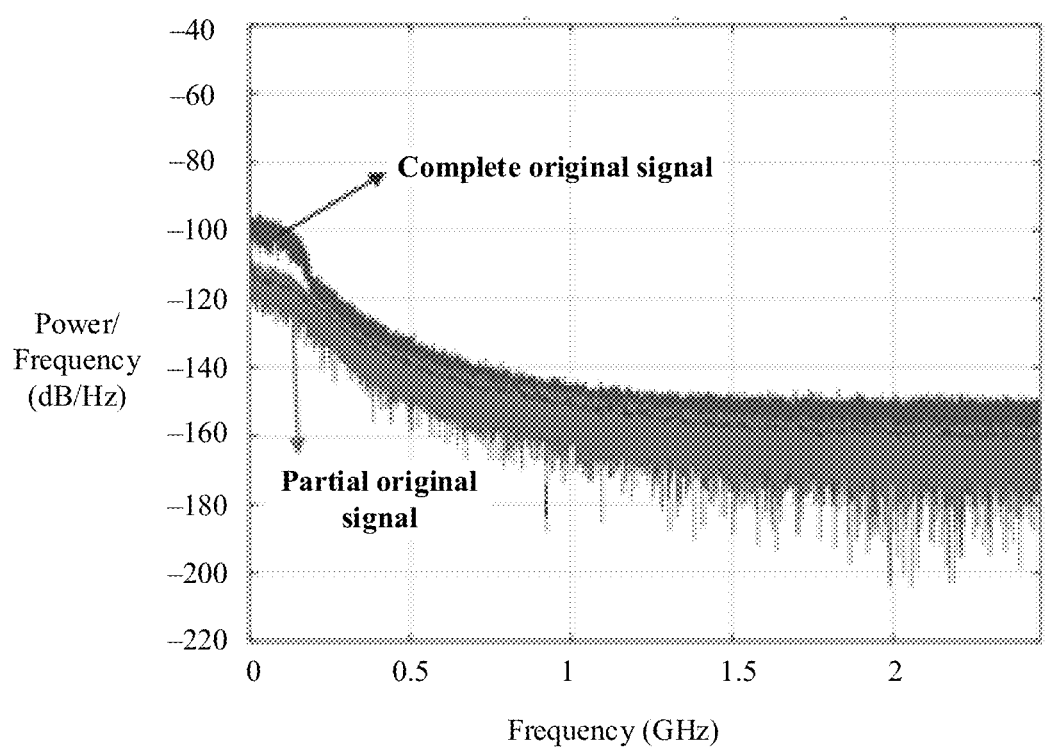
FIG. 8 is a spectrum diagram of a signal according to an embodiment of this application.

Compared with a conventional polar solution, in this application, polar processing needs to be performed on only a portion (to be specific, a portion that exceeds a threshold) of the input signal. FIG. 8 is a spectrum diagram of an amplitude signal obtained after processing in different polar methods. A bandwidth of the amplitude signal obtained after complete polar processing is expanded to be relatively large, and a solution in which partial polar processing is performed may significantly reduce a bandwidth expansion effect. For example, a power value equal to −140 dB/Hz is used as a reference. After partial polar processing is used, an expanded bandwidth of the amplitude signal may be reduced from 580 MHz to 360 MHz. Therefore, in this application, polar processing is performed on a portion of a signal, so that a bandwidth expansion effect can be effectively reduced.

Figure 9A:
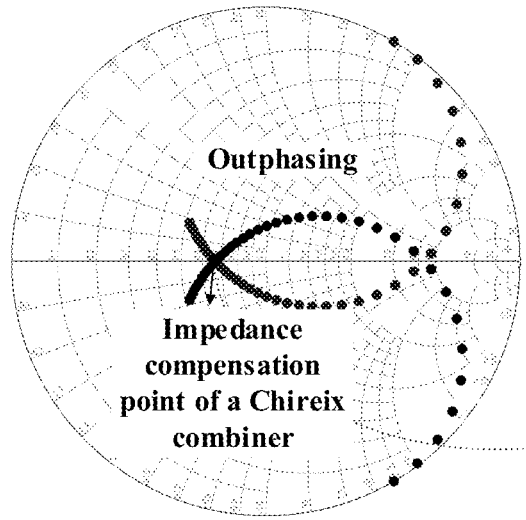
FIG. 9(*a*) to FIG. 9(*d*) show load impedance variation curves of outphasing PAs according to an embodiment of this application.
Figure 9B:
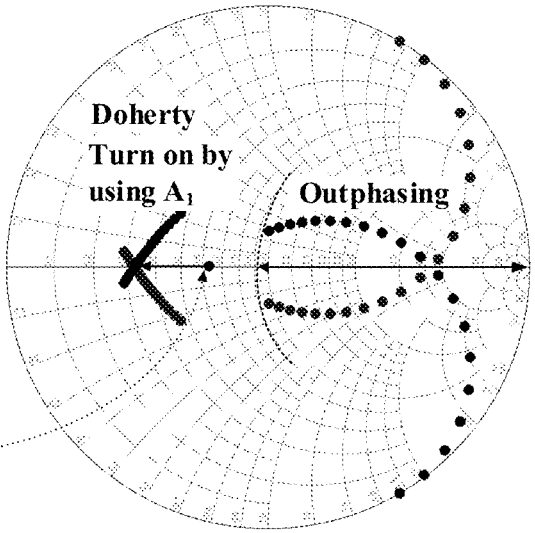
Figure 9C:
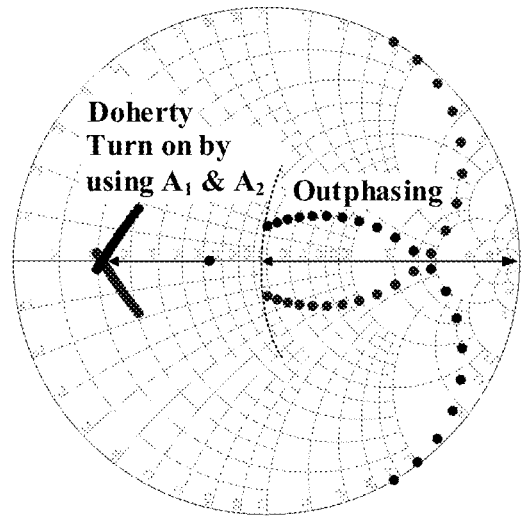
Figure 9D:
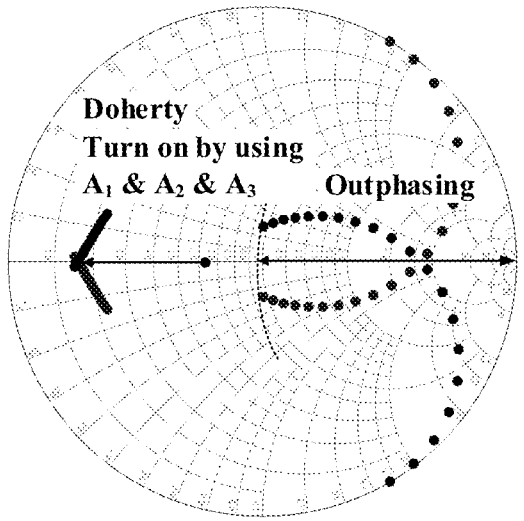

FIG. 9(a) to FIG. 9(d) show load impedance variation curves of the outphasing PAs in this embodiment. FIG. 9(a) shows load impedance variation curves in which only the outphasing PAs are turned on, to be specific, shows variation cases of load impedance of the two paths of outphasing PAs with θ(t) in a case in which there is no Doherty load modulation (which is shown in FIG. 9(a)). Because of action of a Chireix compensating network, there are two points at which an imaginary part of the impedance is equal to zero. FIG. 9(b) shows load impedance variation curves in which the outphasing PAs and the polar PA 331 are turned on. Because of action of a Doherty load modulation effect, the load impedance of the two paths of outphasing PAs are reduced, and are moved to the left in a Smith chart. FIG. 9(c) shows load impedance variation curves in which the outphasing PAs are turned on and the polar PA 331 and the polar PA 332 are turned on by using the control signals $A_1$ and $A_2$. FIG. 9(d) shows load impedance variation curves in which the outphasing PAs are turned on and the polar PA 331, the polar PA 332, and the polar PA 333 are turned on by using the control signals $A_1$, $A_2$, and $A_3$. Clearly, the load impedance decreases gradually with an increase in a quantity of polar PAs that are turned on.

Figure 10:
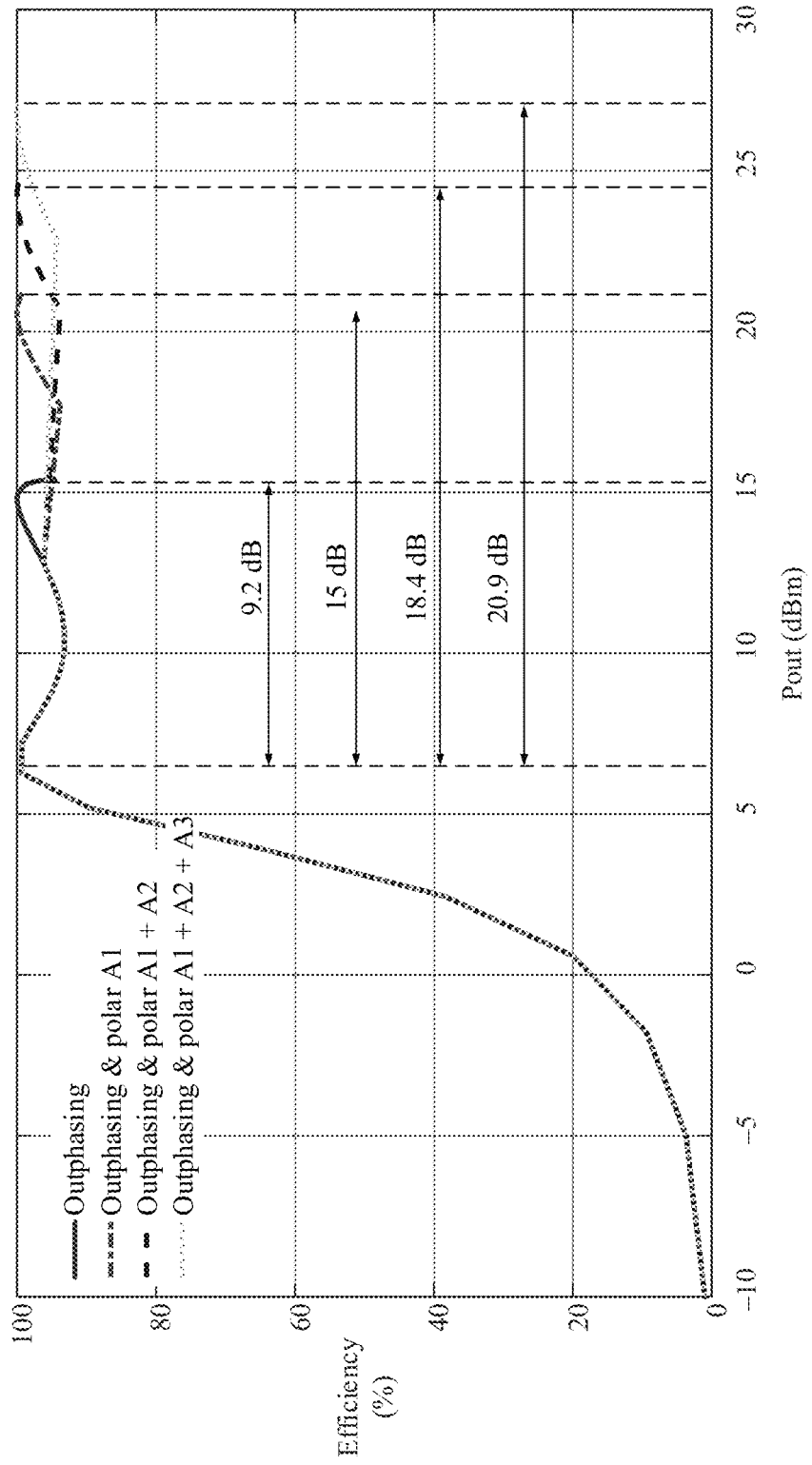
FIG. 10 is a curve diagram of efficiency of a system according to an embodiment of this application.

In conclusion, because of the Doherty load modulation effect, the load impedance of the outphasing PAs decrease correspondingly, and as the quantity of the polar PAs that are turned on increases, the load impedance of the outphasing PAs become smaller and corresponding output powers become larger. Therefore, in this application, sizes of the output powers may be adjusted by controlling the quantity of the polar PAs that are turned on, to adapt to different PAPR scenarios. For example, FIG. 10 shows an efficiency curve that is obtained by applying the technical solution in this embodiment and that is based on ideal model simulation (including an ideal voltage source, a current source, an ideal transmission line, and the like). Refer to FIG. 10. When n=3 (that is, when the DSP module 310 outputs the control signals $A_1$, $A_2$, and $A_3$, to turn on corresponding polar power amplifiers), a high efficiency value may still be obtained in a 20.9 dB backoff area, where a backoff area of outphasing is determined by a Chireix compensation unit, and is 9.2 dB in this embodiment.

It should be noted that, if a PAR of the input signal is 21 dB, it is required that a peak output power of the system reaches 30 dBm, and a corresponding average power is 9 dBm. In this case, statuses of $A_1$, $A_2$, and $A_3$ need to be dynamically controlled, to improve efficiency of a 21 dB deep backoff area. If the PAR of the input signal is 18 dB, it is required that the peak output power reaches 30 dBm, and the corresponding average power is 12 dBm. In this case, statuses of $A_1$ and $A_2$ need to be dynamically controlled, to improve efficiency of an 18 dB deep backoff area. If the PAR of the input signal is 15 dB, it is required that the peak output power reaches 30 dBm, and the corresponding average power is 15 dBm. In this case, a status of $A_1$ needs to be dynamically controlled, to improve efficiency of a 15 dB deep backoff area. If the PAR of the input signal is 9 dB, only the outphasing PAs may operate, or the Chireix compensating network may be modified, to reduce backoff areas of the outphasing PAs and control the statuses of $A_1$, $A_2$, and $A_3$, thereby improving efficiency of a 9 dB backoff area.

In conclusion, in this application, efficient transmission of signals with different PARs may be implemented through flexible control. That is, in this application, an efficient requirement in signal scenarios with different PARs may be met by controlling the quantity of the digital polar PAs that are turned on.

Figure 11:
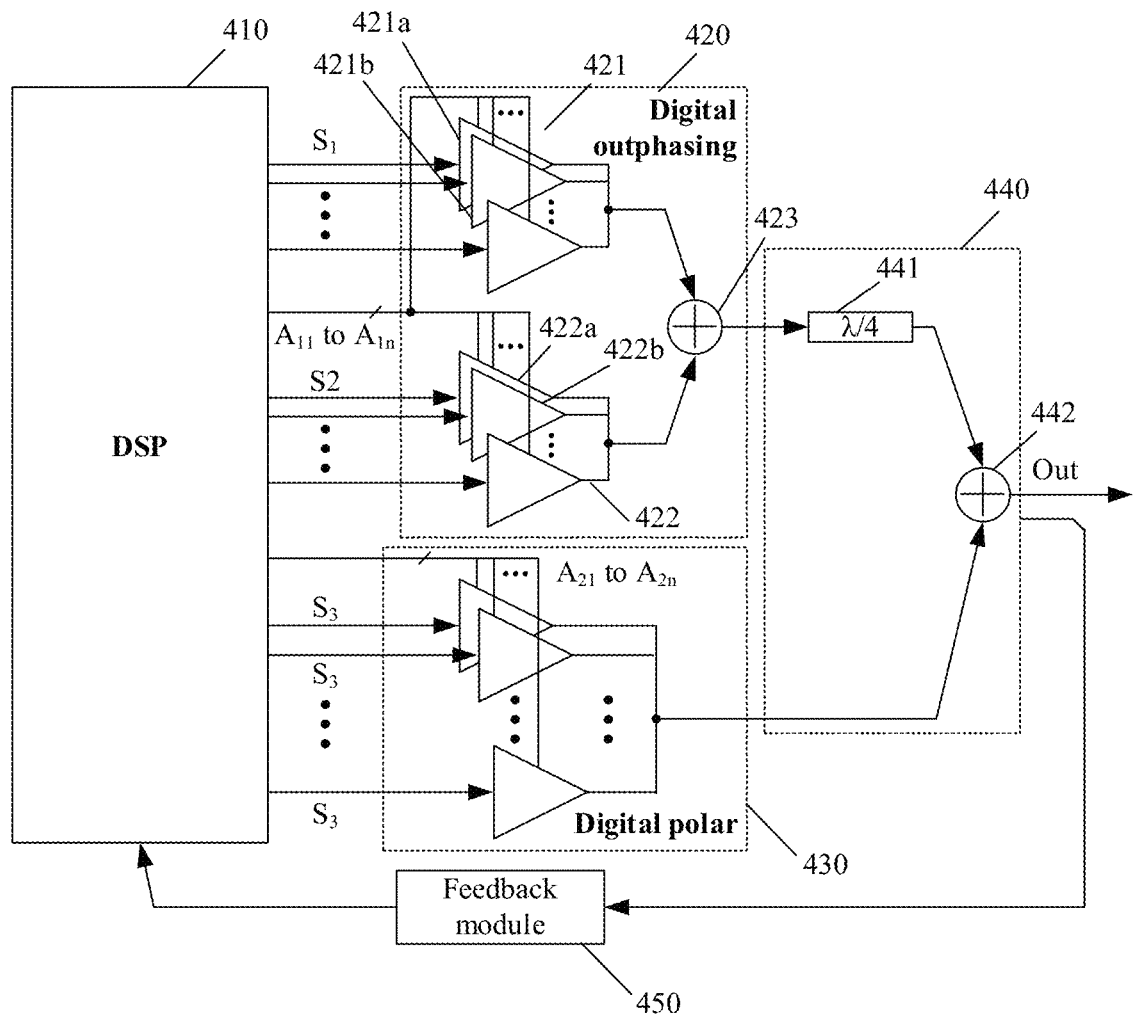
FIG. 11 is a schematic structural diagram of a signal processing system according to an embodiment of this application.

FIG. 11 is a schematic structural diagram of a signal processing system according to an embodiment of this application. In FIG. 11:

A signal processing system 400 includes a DSP module 410 and two paths of load modulation modules connected in parallel, where the two paths of load modulation modules include a main power amplification module 420 and an auxiliary power amplification module 430. In addition, the signal processing system 400 further includes a combination module 440 and a feedback module 450.

Refer to FIG. 11. An output end of the DSP module 410 in the signal processing system 400 is separately connected to input ends of the two paths of load modulation modules (namely, the main power amplification module 420 and the auxiliary power amplification module 430). In addition, an input end of the combination module 440 is separately connected to output ends of the two paths of load modulation modules (namely, the main power amplification module 420 and the auxiliary power amplification module 430). In addition, an output end of the combination module 440 is connected to an input end of the feedback module 450, and an output end of the feedback module 450 is connected to an input end of the DSP module 410, thereby forming a feedback loop.

Optionally, in this application, the main power amplification module 420 includes two outphasing power amplifier arrays connected in parallel (namely, an outphasing power amplifier array 421 and an outphasing power amplifier array 422 in the figure, where each outphasing power amplifier array includes two or more outphasing power amplifiers; and it should be noted that, the outphasing power amplifiers in the two paths of outphasing power amplifier arrays are disposed in pairs, for example, an outphasing PA 421a in the outphasing power amplifier array 421 and an outphasing PA 422a in the outphasing power amplifier array 422 are a pair; to be specific, a control signal $A_{11}$ may be used to control the outphasing PA 421a and the outphasing PA 422a). In other words, a main power amplifier in a Doherty PA is quantified as an array including a plurality of outphasing power amplifiers.

Optionally, in this application, the main power amplification module 420 further includes a combination unit 423. Optionally, the combination unit 423 may be a low-isolation Chireix combiner, and includes an inductor and a capacitor. In another embodiment, the combiner may alternatively be another low-isolation combiner. This is not limited in this application.

In addition, the auxiliary power amplification module 430 includes a digital polar power amplifier array. In other words, an auxiliary power amplifier may be quantified as an array including a plurality of (to be specific, two or more) polar power amplifiers.

In addition, in this embodiment of this application, the combination module 440 includes a transmission line 441 and a combiner 442.

Figure 12:
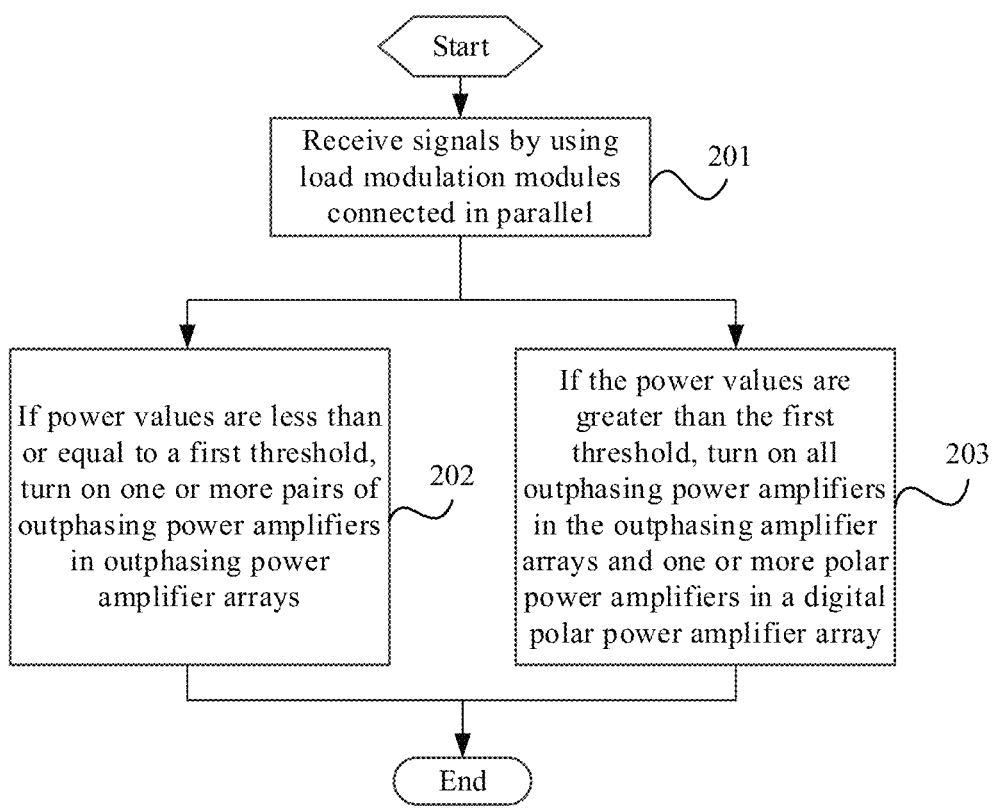
FIG. 12 is a flowchart of a signal processing method according to an embodiment of this application.

With reference to FIG. 11, FIG. 12 shows a signal processing method according to an embodiment of this application. The method is applied to the signal processing system shown in FIG. 11. The method includes the following steps.

Step 201: Receive signals by using load modulation modules connected in parallel.

Specifically, in this embodiment of this application, the DSP module performs digital signal processing on a signal (to distinguish from another signal such as an output signal, the signal is collectively referred to as an input signal in this embodiment and the following embodiments), and then the DSP module sends a processed input signal to the input ends of the two paths of load modulation modules by using the output end. As shown in FIG. 11, the signals input into the two paths of load modulation modules include input signals $S_1$ and $S_2$ and control signals $A_{11}$ to $A_{1n}$ of the two paths of outphasing PAs, and an input signal $S_3$ and control signals $A_{21}$ to $A_{2n}$ of the digital polar PAs.

Optionally, in this application, the load modulation modules may constitute a Doherty PA structure. To be specific, the load modulation modules in this application may operate in a Doherty load modulation mode. Specifically, based on the foregoing operating principle of the Doherty PA, that is, when the input signal is relatively small, the main power amplifier is turned on, and the auxiliary power amplifiers are turned off; and when the input signal is relatively large, the main power amplifier and the auxiliary power amplifiers are all turned on.

In this application, there may be two methods for determining a size of the input signal. For specific details, refer to step 101. Details are not described herein.

Similar to step 101, in this embodiment, when the input signal is relatively large, the DSP module also determines, based on an amplitude value or based on a phase value obtained after outphasing conversion, whether a trigger condition of each digital polar power amplifier in the auxiliary power amplification module 430 is met. If the trigger condition of each digital polar power amplifier in the auxiliary power amplification module 430 is met, $S_3$ and a corresponding control signal $A_{2n}$ are output.

Step 202: If power values are less than or equal to a first threshold, turn on one or more pairs of outphasing power amplifiers in the outphasing power amplifier arrays.

Optionally, in this application, when the input signal is relatively small (to be specific, the amplitude value of the input signal is less than or equal to an amplitude threshold or the phase value obtained after outphasing conversion is greater than a phase threshold), the DSP module 410 may further determine, based on a stored trigger condition of each pair of outphasing power amplifiers in the outphasing power amplifier arrays, outphasing power amplifiers to be turned on. For example, a trigger condition of the outphasing PA 421a and the outphasing PA 422a is that the amplitude value of the input signal reaches an amplitude value 1, and a trigger condition of an outphasing PA 421b and an outphasing PA 422b is that the amplitude value of the input signal reaches an amplitude value 2. Therefore, when the amplitude value of the input signal reaches the amplitude value 1, the DSP module 410 outputs the two paths of signals $S_1$ and $S_2$ and the control signal $A_{11}$, to turn on the outphasing PA 421a and the outphasing PA 422a. When the amplitude value of the input signal reaches the amplitude value 2, the DSP module 410 outputs the two paths of signals $S_1$ and $S_2$ and the control signals $A_{11}$ and $A_{12}$, to turn on the outphasing PA 421a, the outphasing PA 422a, the outphasing PA 421b, and the outphasing PA 422b.

Other details are similar to those in step 102, and are not described herein.

Step 203: If the power values are greater than the first threshold, turn on all outphasing power amplifiers in the outphasing power amplifier arrays and one or more polar power amplifiers in the digital polar power amplifier array.

Still refer to FIG. 11. If the DSP module 410 determines that the input signal is a relatively large signal, as described above, optionally, the DSP module 410 may perform outphasing conversion on the input signal, to obtain the two paths of signals $S_1$ and $S_2$, and the DSP module 410 outputs $S_1$ and $S_2$ and the control signals $A_1$ to $A_{1n}$ to the main power amplification module 420, to turn on all the outphasing power amplifiers in the outphasing power amplifier arrays. The outphasing power amplifiers respectively amplify the two paths of signals, and output processed signals to the Chireix combiner 423 in the main power amplification module 420. In addition, the DSP module 410 performs polar processing on the input signal, to obtain the input signal $S_3$ and the control signals $A_{21}$ to $A_{2n}$.

Optionally, in this application, the DSP module 410 stores a trigger condition of one or more power amplifiers in the digital polar power amplifier array. The DSP module 410 may determine, based on the amplitude value of the input signal or based on the phase value obtained after outphasing conversion and the trigger condition, a polar power amplifier to be turned on, and output corresponding control signals $A_{2n}$ and $S_3$.

Other details are similar to those in step 103, and are not described herein.

Figure 13:
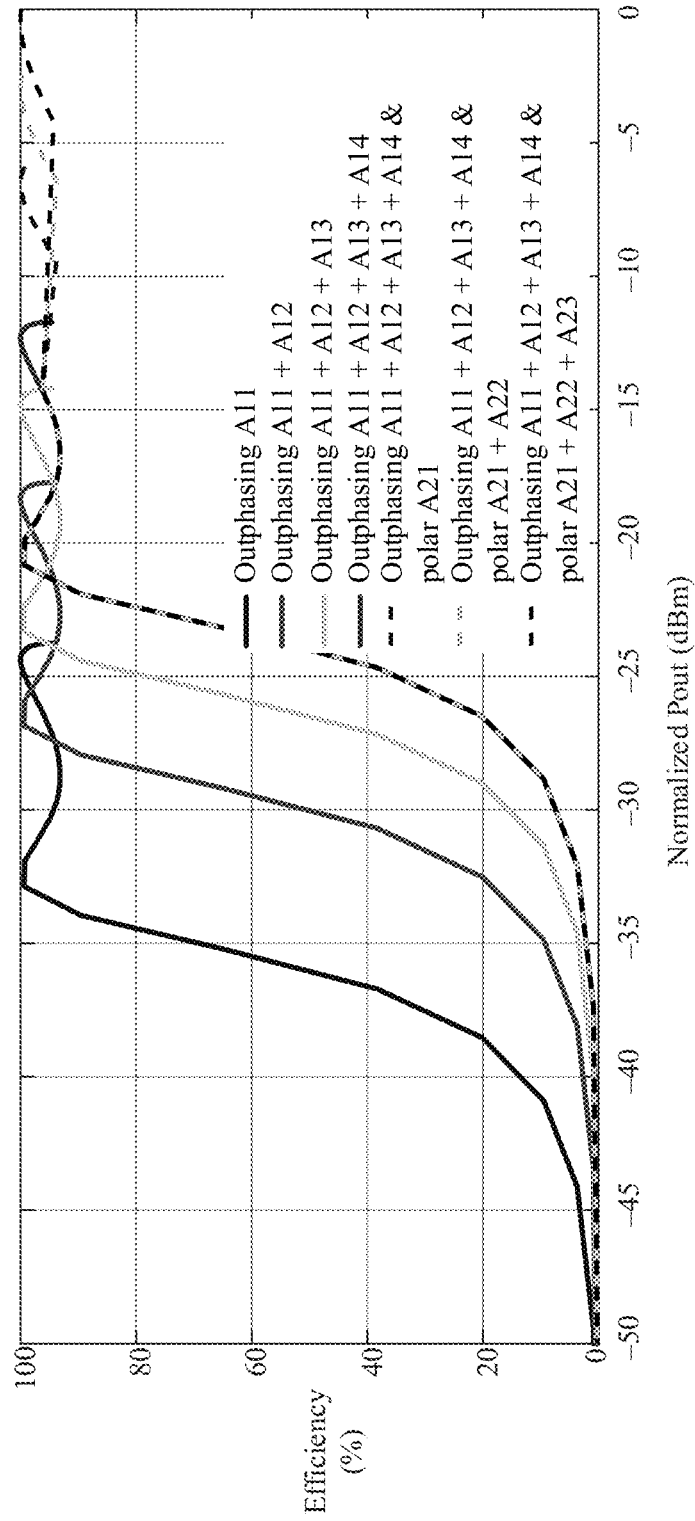
FIG. 13 is a curve diagram of efficiency of a system according to an embodiment of this application.

FIG. 13 shows an efficiency curve that is obtained by applying the technical solution in this embodiment and that is based on ideal model simulation (including an ideal voltage source, a current source, an ideal transmission line, and the like), where the outphasing PAs are quantified as 4 bits, and the polar PAs are quantified as 3 bits. FIG. 13 shows corresponding efficiency curves when power amplifiers of a plurality of quantity combinations are turned on, including: a corresponding efficiency curve when only outphasing power amplifiers controlled by the control signal $A_{11}$ in the outphasing power amplifiers (namely, only the main power amplifier module 420) are turned on; a corresponding efficiency curve when outphasing power amplifiers controlled by the control signals $A_{11}$ and $A_{12}$ in the outphasing power amplifiers are turned on; a corresponding efficiency curve when outphasing power amplifiers controlled by the control signals $A_{11}$, $A_{12}$, and $A_{13}$ in the outphasing power amplifiers are turned on; a corresponding efficiency curve when outphasing power amplifiers controlled by the control signals $A_{11}$, $A_{12}$, $A_{13}$, and $A_{14}$ in the outphasing power amplifiers are turned on; a corresponding efficiency curve when all the outphasing power amplifiers in the main power amplification module are turned on and the polar power amplifier controlled by the control signal $A_{21}$ in the digital polar power amplifier array are turned on; a corresponding efficiency curve when all the outphasing power amplifiers in the main power amplification module are turned on and the polar power amplifiers controlled by the control signals $A_{21}$ and $A_{22}$ in the digital polar power amplifier array are turned on; and a corresponding efficiency curve when all the outphasing power amplifiers in the main power amplification module are turned on and all polar power amplifiers in the digital polar power amplifier array are turned on. Clearly, the system may still obtain a high efficiency value in a 33 dB backoff area (to be specific, when all the power amplifiers are turned on), thereby further improving efficiency of the backoff area.

Figure 14:
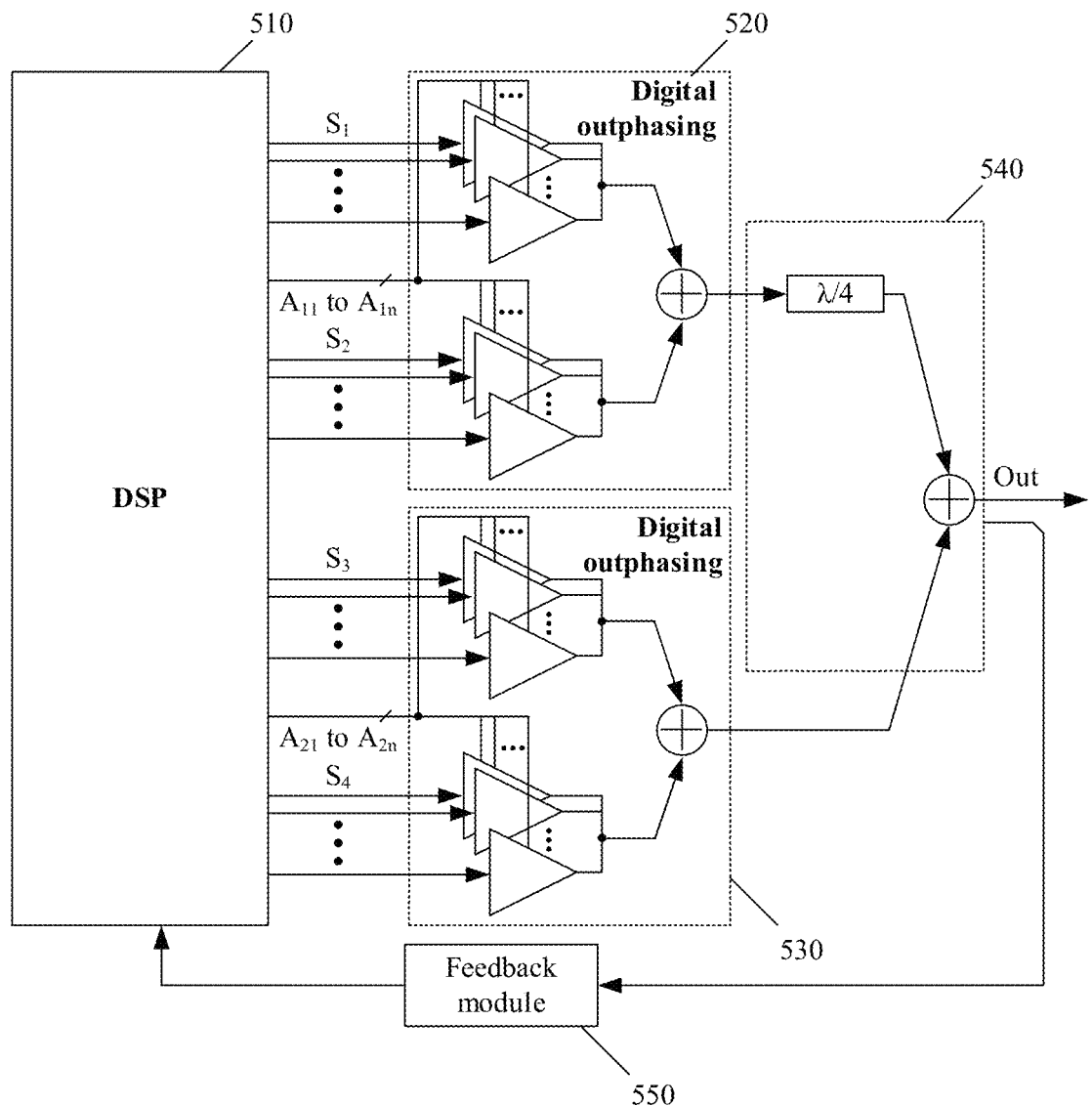
FIG. 14 is a schematic structural diagram of a signal processing system according to an embodiment of this application.

Optionally, FIG. 14 is a schematic structural diagram of another signal processing system according to an embodiment of this application. In FIG. 14, the system includes a DSP module 510, a main power amplification module 520 in a Doherty load modulation mode, an auxiliary power amplification module 530, a combination module 540, and a feedback module 550. The main power amplification module 520 in the Doherty load modulation modules may include two paths of digital outphasing power amplifier arrays, and the auxiliary power amplification module 530 may include two paths of digital outphasing power amplifier arrays. The main power amplification module 520 and the auxiliary power amplification module 530 may implement the Doherty load modulation mode, that is, when an input signal is relatively small, the main power amplification module is turned on, and when the input signal is relatively large, the main power amplification module and the auxiliary power amplification module are turned on. Optionally, when the input signal is relatively small, the DSP module may turn on two or more outphasing power amplifiers in the main power amplification module based on a trigger condition of each outphasing power amplifier in the main power amplification module. In addition, when the input signal is relatively large, the DSP module 510 may turn on all outphasing power amplifiers included in the main power amplification module, and turn on one or more pairs of outphasing power amplifiers in the auxiliary power amplification module based on a trigger condition of each pair of outphasing power amplifiers included in the auxiliary power amplification module. For specific details, refer to the foregoing embodiments. Details are not described herein.

Figure 15:
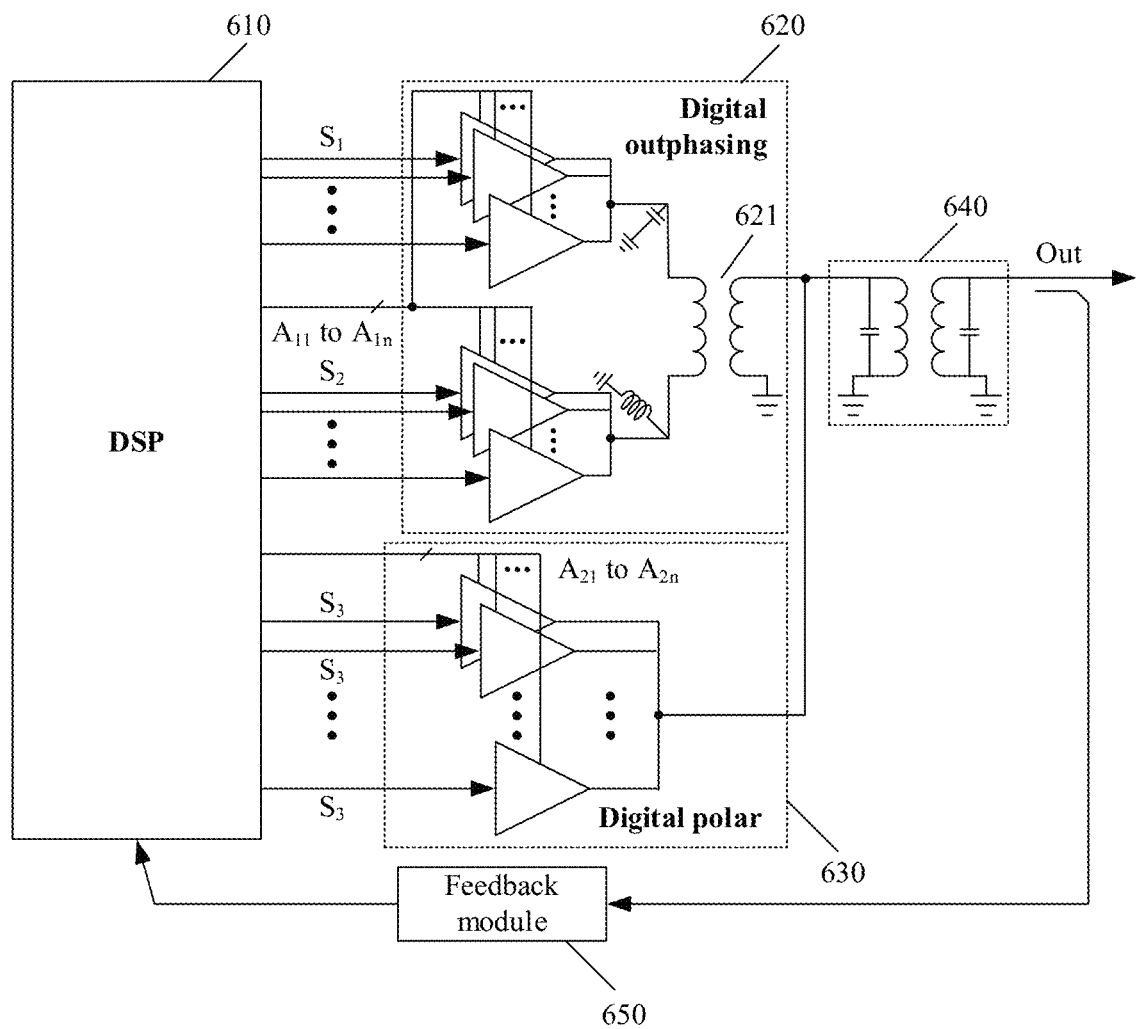
FIG. 15 is a schematic structural diagram of a signal processing system according to an embodiment of this application.

Optionally, FIG. 15 is a schematic structural diagram of a signal processing system according to an embodiment of this application. In FIG. 15, the system includes a DSP module 610, a main power amplification module 620 in a Doherty load modulation mode, an auxiliary power amplification module 630, a combination module 640, and a feedback module 650. Optionally, the main power amplification module 620 further includes a Chireix combiner 621, and the combination module 640 may be a Doherty combiner. The Chireix combiner 621 and the Doherty combiner 640 each use a transformer to implement Chireix outphasing active load modulation and Doherty active load modulation, and reduce a size of the system to implement on-chip integration by using a CMOS process. It should be noted that, the structure in this embodiment may be used in any system shown in FIG. 4, FIG. 11, and FIG. 14. That is, the main power amplification module and/or the auxiliary power amplification module including outphasing power amplifiers or outphasing power amplifier arrays may use the Chireix combiner including the transformer, and the Doherty combiner also uses a transformer structure.

Optionally, in this application, the main power amplification module in the Doherty load modulation mode may also be a digital polar power amplifier array, and the auxiliary power amplification module may be a conventional outphasing power amplifier or a digital outphasing power amplifier array. For an operating method of the system, refer to the foregoing embodiments. Details are not described herein.

It should be noted that, in this application, only two paths of Doherty structures are used as an example for description. Optionally, in this application, the signal processing system may include n paths of load modulation modules, where n is an integer greater than 1. For example, the signal processing system may include three paths of load modulation modules. Then paths of load modulation module include one path of main power amplification module and (n−1) paths of auxiliary power amplification modules. Functions of modules in a multi-path Doherty structure are similar to those described in the embodiments of this application, that is, the main power amplification module may implement an outphasing mode, and the (n−1) paths of auxiliary power amplification modules may implement a digital outphasing mode and/or a digital polar mode. The auxiliary power amplification module is in a non-operating state when an input signal is relatively small. In other words, the auxiliary power amplification module is turned on only when the input signal is relatively large. In this application, a larger quantity of paths of auxiliary power amplification modules in the system indicates higher efficiency of a backoff area and a larger depth of the backoff area. However, considering limitation on complexity of the system, two paths of load modulation structures, namely, n=2, may be usually used, to achieve a deep backoff area under a target that a process can be implemented.

The foregoing mainly describes solutions provided in the embodiments of this application from the perspective of interaction between network elements. It may be understood that, to implement the foregoing functions, a signal processing apparatus includes corresponding hardware structures and/or software modules for performing various functions. A person of ordinary skill in the art should easily be aware that, with reference to the units and algorithm steps described in the embodiments disclosed in this application, the embodiments of this application can be implemented in a form of hardware or a combination of hardware and computer software. Whether a function is performed by hardware or hardware driven by computer software depends on particular applications and design constraints of the technical solutions. A person skilled in the art may use different methods to implement the described functions for each particular application, but it should not be considered that the implementation goes beyond the scope of this application.

According to the embodiments of this application, the signal processing apparatus may be divided into functional modules based on the foregoing method examples. For example, each functional module may be obtained through division corresponding to each function, or two or more functions may be integrated into one processing module. The integrated module may be implemented in a form of hardware, or may be implemented in a form of a software functional module. It should be noted that, in this embodiment of this application, module division is an example, and is merely a logical function division. In actual implementation, another division method may be used.

Figure 16:
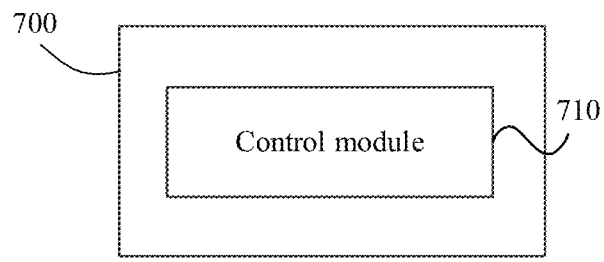
FIG. 16 is a schematic structural diagram of a signal processing apparatus according to an embodiment of this application.

When the functional modules are obtained through division by using corresponding functions, FIG. 16 is a possible schematic structural diagram of a signal processing apparatus 700 involved in the foregoing embodiments. As shown in FIG. 16, the signal processing apparatus may include: a control module 710, where the module is configured to control n paths of load modulation modules connected in parallel to receive signals. The control module 710 may be further configured to turn on one or more paths of load modulation modules in the n paths of load modulation modules based on power values of the signals.

All related content of each step involved in the foregoing method embodiments may be referred to a function description of a corresponding functional module, and details are not described herein.

Based on a same technical concept, an embodiment of this application further provides a computer-readable storage medium. The computer-readable storage medium stores a computer program. The computer program includes at least one segment of code. The at least one segment of code may be executed by a signal processing apparatus, to control a signal processing apparatus to implement the foregoing method embodiments.

Based on a same technical concept, an embodiment of this application further provides a computer program. The computer program is used to implement the foregoing method embodiments when being executed by a signal processing apparatus.

The program may be completely or partially stored in a storage medium packaged with a processor, or may be partially or completely stored in a memory not packaged with the processor.

Based on a same technical concept, an embodiment of this application further provides a processor, and the processor is configured to implement the foregoing method embodiments. The processor may be a chip.

Methods or algorithm steps described in combination with the content disclosed in this embodiment of this application may be implemented by hardware, or may be implemented by a processor by executing software instructions. The software instructions may include a corresponding software module. The software module may be stored in a random access memory (RAM), a flash memory, a read only memory (ROM), an erasable programmable read only memory (EPROM), an electrically erasable programmable read only memory (EEPROM), a register, a hard disk, a removable hard disk, a compact disc read-only memory (CD-ROM), or any other form of storage medium well-known in the art. For example, a storage medium is coupled to a processor, so that the processor can read information from the storage medium or write information into the storage medium. Certainly, the storage medium may be a component of the processor. The processor and the storage medium may be located in the ASIC. In addition, the ASIC may be located in network equipment. Certainly, the processor and the storage medium may exist in network equipment as discrete components.

A person skilled in the art should be aware that in the foregoing one or more examples, functions described in the embodiments of this application may be implemented by hardware, software, firmware, or any combination thereof. When the functions are implemented by software, the foregoing functions may be stored in a computer-readable medium or transmitted as one or more instructions or code in the computer-readable medium. The computer-readable medium includes a computer storage medium and a communications medium, where the communications medium includes any medium that enables a computer program to be transmitted from one place to another. The storage medium may be any available medium accessible to a general-purpose or dedicated computer.

The foregoing describes the embodiments of this application with reference to the accompanying drawings. However, this application is not limited to the foregoing specific implementations. The foregoing specific implementations are merely examples, and are not restrictive. Under the enlightenment of this application, many forms may be further made by a person of ordinary skill in the art without departing from the objective of this application and the protection scope of the claims and shall fall within the protection scope of this application.

What is claimed is:

1. A signal processing system, comprising:
two load modulation modules and a combination module, wherein
the two load modulation modules are connected in parallel, an output end of each load modulation module is connected to an input end of the combination module, and the combination module receives, at the input end, signals output by the two load modulation modules and combines the signals;

the two load modulation modules comprise a main power amplification module and an auxiliary power amplification module, and the auxiliary power amplification module is turned on when power values of signals received by input ends of the two load modulation modules are greater than a first threshold; and the main power amplification module comprises two outphasing power amplification units, and the auxiliary power amplification module comprises a digital polar power amplifier array.

2. The system according to claim 1, wherein the two outphasing power amplification units each comprise a digital outphasing power amplifier array.

3. The system according to claim 1, wherein the two outphasing power amplification units are connected in parallel.

4. The system according to claim 1, wherein the main power amplification module further comprises a combiner, output ends of the two outphasing power amplification units are separately connected to an input end of the combiner, an output end of the combiner is the output end of the main power amplification module that is connected to the input end of the combination module, and the combiner is configured to combine two signals output by the two outphasing power amplification units; and the combiner and the combination module each comprise a transformer.

5. The system according to claim 4, wherein the combiner is a Chireix combiner, and the combination module is a Doherty combiner.

6. A signal processing method, comprising:
receiving signals by both a main power amplification module and an auxiliary power amplification module connected in parallel;
turning on the auxiliary power amplification module when power values of the signals are greater than a first threshold; and
wherein the main power amplification module comprises two outphasing power amplification units, and the auxiliary power amplification module comprises a digital polar power amplifier array.

7. The method according to claim 6, wherein the main power amplification module is turned on when the amplitude values of the signals meet a trigger condition of one or more power amplifiers in the outphasing power amplifier arrays.

8. The method according to claim 6, wherein
the main power amplification module is turned on when if phase values of the signals are greater than or equal to a third threshold; or
the auxiliary power amplification module is turned on when the phase values of the signals are less than the third threshold, wherein
the phase values are obtained after outphasing conversion is performed on the signals.

9. The method according to claim 8, wherein when the phase values of the signals meet a trigger condition of one or more power amplifiers in the digital polar power amplifier array, turning on the one or more power amplifiers.

10. A signal processing apparatus, comprising:
a control module, configured to control a main power amplification module and an auxiliary power amplification module connected in parallel to receive signals, wherein the control module is further configured to turn on the main power amplification module and the auxiliary power amplification module based on power values of the signals; and when the power values are less than or equal to a first threshold, turn on the main power amplification module; or when the power values are greater than the first threshold, turn on the auxiliary power amplification module, wherein the main power amplification module comprises two outphasing power amplification units, and the auxiliary power amplification module comprises a digital polar power amplifier array.

11. The apparatus according to claim 10, wherein the control module is further configured to:
if amplitude values of the signals are less than or equal to a second threshold, turn on the main power amplification module; or
if the amplitude values of the signals are greater than the second threshold, turn on the auxiliary power amplification module.

12. The apparatus according to claim 10, wherein the control module is further configured to:
when the amplitude values of the signals meet a trigger condition of one or more power amplifiers in the outphasing power amplifier arrays.

13. The apparatus according to claim 10, wherein the control module is further configured to:
when phase values of the signals are greater than or equal to a third threshold, turn on the main power amplification module; or
when the phase values of the signals are less than the third threshold, turn on the auxiliary power amplification module, wherein
the phase values are obtained after outphasing conversion is performed on the signals.

14. The apparatus according to claim 13, wherein the control module is further configured to:
when the phase values of the signals meet a trigger condition of one or more power amplifiers in the digital polar power amplifier array, turn on the one or more power amplifiers.

15. The apparatus according to claim 10, wherein the two outphasing power amplification units include a first outphasing power amplification unit and a second outphasing power amplification unit, and the apparatus further comprises:
a digital signal processor module configured to
perform outphasing conversion on an input signal to obtain the signals, wherein the signals include two signals $S_1$ and $S_2$,
output signal $S_1$ to the first outphasing power amplification unit, and
output signal $S_2$ to the second outphasing power amplification unit.

16. The apparatus according to claim 15, wherein the main power amplification module further comprises a combiner having an input end and an output end, wherein output ends of the first and second outphasing power amplification units are connected to the input end of the combiner and the combiner combines amplified signals from the first and second outphasing power amplification units.

17. The apparatus according to claim 16, wherein the digital signal processor module is further configured to convert the input signal into a signal $S_3$, and further configured to provide the signal $S_3$ to the two outphasing power amplifier arrays or the one digital polar power amplifier array of the auxiliary power amplification module, wherein the auxiliary power amplification module includes an output end.

18. The apparatus according to claim 17, further comprising a combination module having an input end connected to the output end of the combiner and further connected to the output end of the auxiliary power amplification module and configured to receive and combine the combined amplified signals from the combiner and an amplified signal from the auxiliary power amplification module.

19. The apparatus according to claim 18, further comprising a feedback module connected between an output end of the combination module and an input end of the digital signal processor module.

* * * * *

UNITED STATES PATENT AND TRADEMARK OFFICE
CERTIFICATE OF CORRECTION

| | |
|---|---|
| PATENT NO. | : 12,289,081 B2 |
| APPLICATION NO. | : 17/508080 |
| DATED | : April 29, 2025 |
| INVENTOR(S) | : Zhixiong Ren et al. |

Page 1 of 1

It is certified that error appears in the above-identified patent and that said Letters Patent is hereby corrected as shown below:

In the Claims

In Column 19, Claim 8, Lines 51-52, delete "when if phase" and insert -- when phase --, therefor.

Signed and Sealed this
Fifteenth Day of July, 2025

Coke Morgan Stewart
*Acting Director of the United States Patent and Trademark Office*